United States Patent [19]

Ovshinsky

[11] Patent Number: 4,664,939
[45] Date of Patent: May 12, 1987

[54] VERTICAL SEMICONDUCTOR PROCESSOR

[75] Inventor: Herbert Ovshinsky, Oak Park, Mich.

[73] Assignee: Energy Conversion Devices, Inc., Troy, Mich.

[21] Appl. No.: 837,925

[22] Filed: Mar. 10, 1986

Related U.S. Application Data

[62] Division of Ser. No. 718,571, Apr. 1, 1985, Pat. No. 4,601,260.

[51] Int. Cl.⁴ .................................................. B05D 3/06
[52] U.S. Cl. ........................................ 427/39; 427/47; 427/74; 427/86
[58] Field of Search .......................... 427/39, 74, 86, 47

[56] References Cited

U.S. PATENT DOCUMENTS 4,515,107  5/1985  Fournier et al. .................. 427/39 X
4,557,944  12/1985  Arai ........................................ 427/39

Primary Examiner—Bernard D. Pianalto
Attorney, Agent, or Firm—Marvin S. Siskind; Lawrence G. Norris

[57] ABSTRACT

A vertical processor for the continuous deposition of semiconductor alloy material by glow discharge techniques. The vertical processor includes a plurality of operatively interconnected deposition chambers, at least one chamber of which includes a generally vertical cathode plate about each of the opposed faces of which a plasma region is developed and a substrate continuously passes for the deposition of semiconductor alloy material thereonto. Through the utilization of the vertical deposition scenario, the length of the processor may be substantially foreshortened, power consumption may be substantially decreased and feedstock gases may be more efficiently utilized.

21 Claims, 6 Drawing Figures

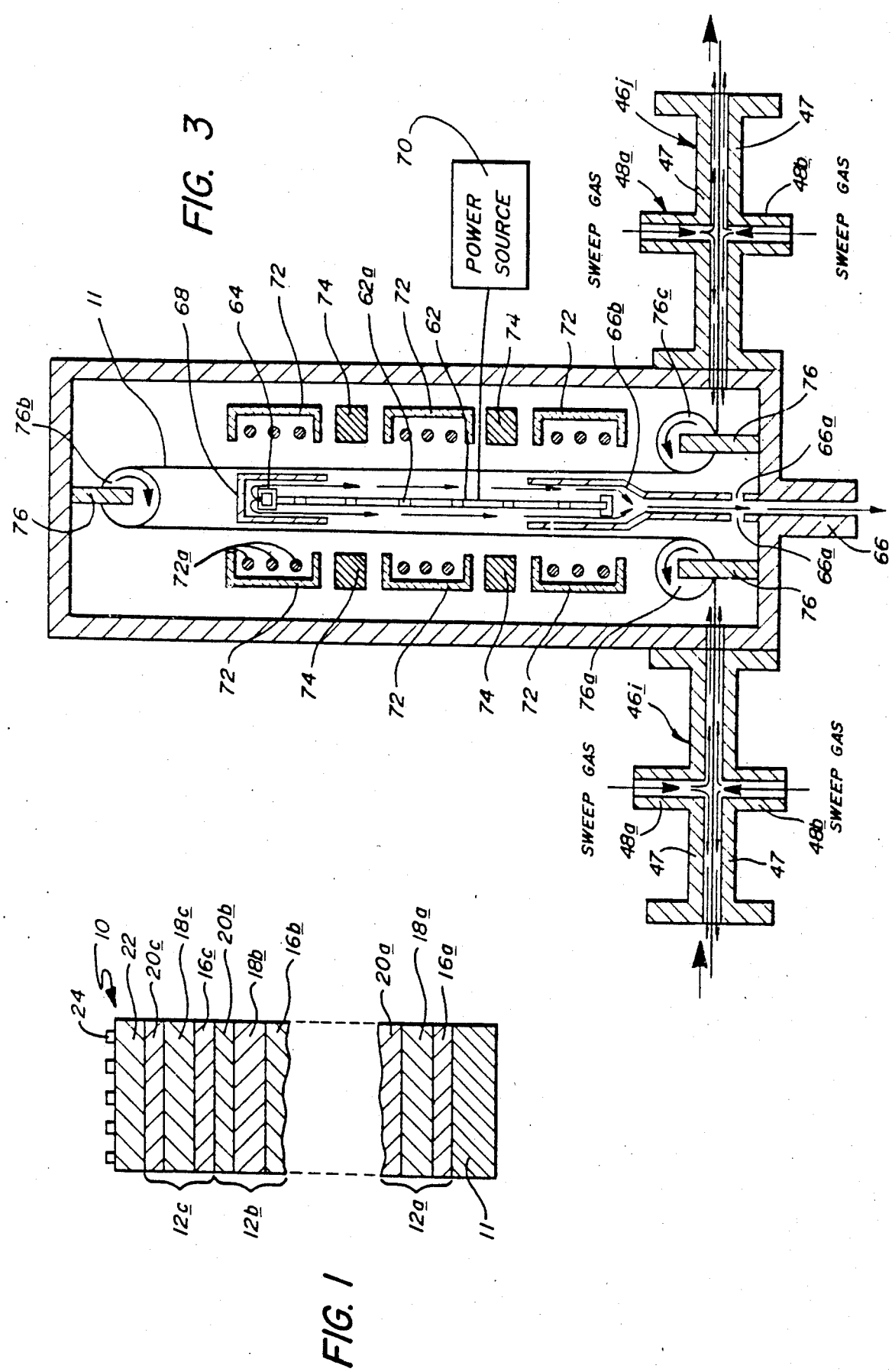

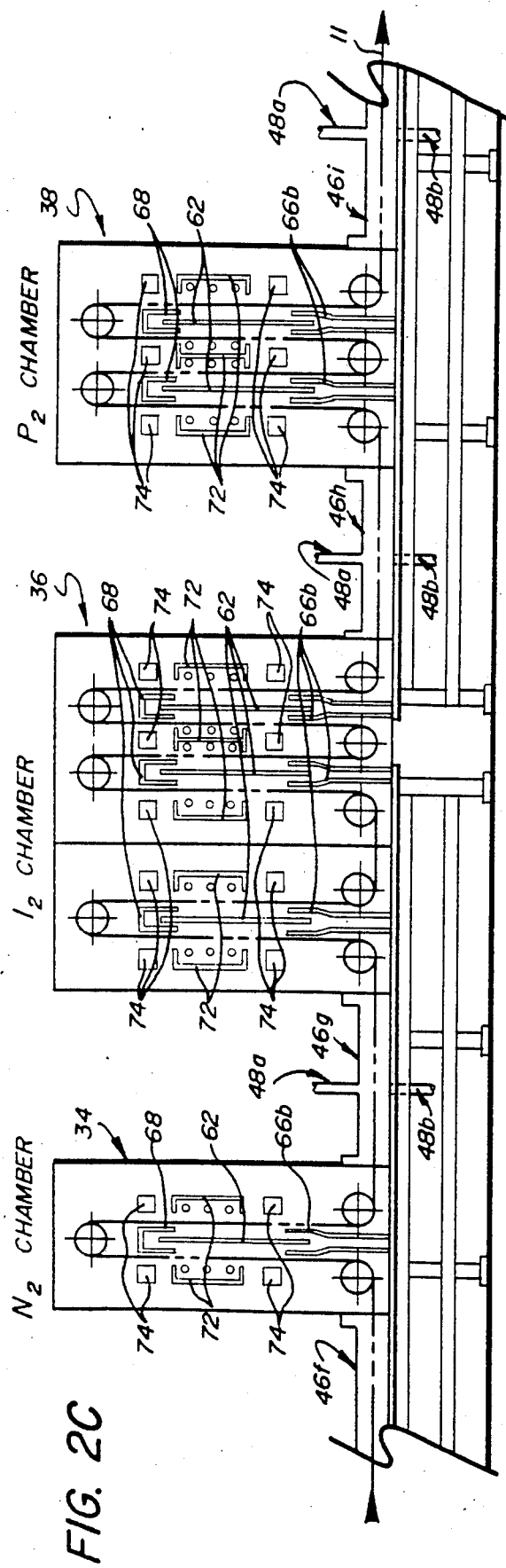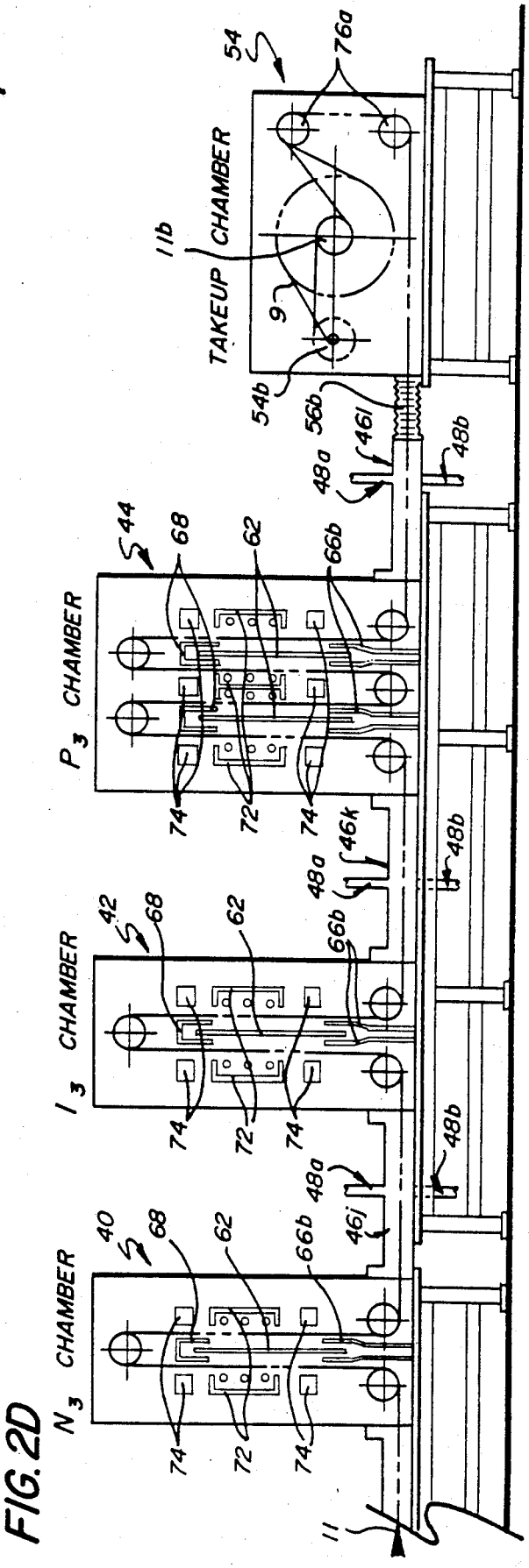

VERTICAL SEMICONDUCTOR PROCESSOR

This is a divisional of application Ser. No. 718,571 filed Apr. 1, 1985 now U.S. Pat. No. 4,601,260.

FIELD OF THE INVENTION

This invention relates generally to thin film semiconductor devices, and more particularly to a commercial processor for the continuous fabrication of photovoltaic devices from successively deposited layers of thin film semiconductor alloy material. A method adapted to continuously fabricate those layers in a manner which provides for the increased utilization of feedstock gases and the foreshortening of the total length of the processor is also disclosed.

BACKGROUND OF THE INVENTION

Owing to the increasing scarcity of non-renewable energy reserves such as coal, petroleum and uranium, increased use is being made of alternative nondepletable energy sources, such as photovoltaic energy. Single crystal photovoltaic devices, especially crystalline silicon photovoltaic devices have been utilized for some time as sources of electrical power because they are inherently non-polluting, silent and consume no expendable natural resources in their operation. However, the utility of such devices has been limited by problems associated with the manufacture thereof. More particularly, single crystal materials (1) are difficult to produce in sizes substantially larger than several inches in diameter; (2) are thicker and heavier than their thin film counterparts; and (3) are expensive and time consuming to fabricate.

Recently, considerable effort has been expended to develop systems and processes for preparing thin film amorphous semiconductor alloy materials which encompass relatively large areas and which can be deposited so as to form p-type and n-type semiconductor alloy layers for the production therefrom of thin film electronic devices, particularly thin film p-n type and n-i-p type photovoltaic devices which are substantially operatively equivalent or superior to their crystalline counterparts. It should be noted at this point that the term "amorphous" as used herein, is defined to include alloys or materials exhibiting long range disorder, although said alloys or materials may exhibit short or intermediate range order or even contain crystalline inclusions. Also, as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occur. It is to be noted that pursuant to the foregoing definitions, the microcrystalline, p-doped, wide band gap, semiconductor alloy material referred to herein falls within the generic term "amorphous".

Amorphous thin film semiconductor alloys have gained acceptance for the fabrication of electronic devices such as photovoltaic cells, photoresponsive and photoconductive devices, transistors, diodes, integrated circuits, memory arrays and the like. This is because the amorphous thin film semiconductor alloys (1) can now be manufactured by relatively low cost continuous processes, (2) possess a wide range of controllable electrical, optical and structural properties and (3) can be deposited to cover relatively large areas. Among the semiconductor alloy materials exhibiting the greatest present commercial significance are amorphous silicon, germanium and silicon-germanium based alloys. Such alloys have been the subject of a continuing development effort on the part of the assignee of the instant invention, said alloys being investigated and utilized as possible candidates from which to fabricate a wide range of semiconductor, eletronic and photoresponsive devices.

The assignee of the present invention is recognized as the work leader in photovoltaic technology. Photovoltaic devices produced by said assignee have set world records for photoconversion efficiency and long term stablility under operating conditions (the efficiency and stability considerations will be discussed in great detail hereinbelow). Additionally, said assignee has developed commercial processes for the continuous roll-to-roll manufacture of large area photovoltaic devices. Such continuous processing systems are disclosed in the following U.S. Patents, disclosures of which are incorporated herein by reference: U.S. Pat. No. 4,400,409, for A Method Of Making P-Doped Silicon Films And Devices Made Therefrom; U.S. No. Pat. 4,410,588, for Continuous Amorphous Solar Cell Production Systems; and U.S. Pat. No. 4,438,723, for Multiple Chamber Deposition and Isolation System And Method. As disclosed in these patents a web of substrate material may be continuously advanced through a succession of operatively interconnected, environmentally protected deposition chambers, wherein each chamber is dedicated to the deposition of a specific layer of semiconductor alloy material onto the web or onto a previously deposited layer. In making a photovoltaic device, for instance, of n-i-p type configurations, the first chamber is dedicated for the deposition of a layer of an n-type semiconductor alloy material, the second chamber is dedicated for the deposition of a layer of substantially intrinsic amorphous semiconductor alloy material, and the third chamber is dedicated for the deposition of a layer of a p-type semiconductor alloy material. The layers of semiconductor alloy material thus deposited in the vacuum envelope of the deposition apparatus may be utilized to form photoresponsive devices, such as, but not limited to, photovoltaic devices which include one or more cascaded n-i-p type cells. By making multiple passes through the succession of deposition chambers, or by providing an additional array of deposition chambers, multiple stacked cells of various configurations may be obtained. Note, that as used herein the term "n-i-p type" will refer to any sequence of n and p or n, i and p semiconductor alloy layers operatively disposed and successively deposited to form a photoactive region wherein charge carriers are generated by the absorbtion of photons from incident radiation.

The concept of utlizing multiple stacked cells, to enhance photovoltaic device efficiency, was described at least as early as 1955 by E. D. Jackson in U.S. Pat. No. 2,949,498 issued Aug. 16, 1960. The multiple cell structures therein discussed were limited to the utilization of p-n junctions formed by single crystalline semiconductor devices. Essentially the concept employed different band gap devices to more efficiently collect various portions of the solar spectrum and to increase open circuit voltage (Voc). The tandem cell device (by definition) has two or more cells with the light directed serially through each cell. In the first cell, a large band gap material absorbs only the sort wavelength light, while in subsequent cells, smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant. Such tandem cell structures can be economically fabricated in large areas by employing thin film amorphous, semiconductor alloy materials (with or without crystalline inclusions), in accordance with the principles of the instant invention. It should be noted that Jackson employed crystalline semiconductor materials for the fabrication of his stacked cell structure; however, since it is virtually impossible to match lattice contents of differing crystalline materials, it is not possible to fabricate such crystalline tandem cell structures in a commercially feasible manner. In contrast thereto, and as the assignee of the instant invention has shown, such tandem cell structures are not only possible, but can be economically fabricated over large areas by employing the amorphous semiconductor alloy materials and the deposition techniques discussed and briefly described herein.

More particularly, the assignee of the instant invention is presently able to manufacture stacked, large area photovoltaic devices on a commercial basis by utilizing the previously referenced, continuous deposition, roll-to-roll processor. That processor is characterized by the assignee as a 1.5 megawatt capcity machine insofar as its annual output of photovoltaic devices is capable of producing 1.5 megawatts of electrical power. Said 1.5 megawatt processor, as presently configured, is adapted to produce tandem photovoltaic cells which comprise two stacked n-i-p type photovoltaic devices disposed optically and electrically in series upon a stainlees steel substrate. The processor currently includes six operatively interconnected, dedicated deposition chambers, each deposition chamber adapted to sequentially deposit one of the layers of semiconductor alloy material from which the tandem device is fabricated. The deposition chambers vary in length depending upon the thickness of the particular layer of semiconductor alloy material to be deposited therein.

More specifically, the thicknesses of individual layers of semiconductor alloy material vary from approximately 100 angstroms for the doped layers to approximately 3500 angstroms for the lowermost intrinsic layer. Since the processor operates by developing an r.f. plasma which is adapted to decompose the process gases and deposits a layer of semiconductor alloy material and the thickness of the deposited layer is directly dependent upon the residence time of the web of substrate material in the deposition chamber, the 3500 angstrom thick layer requires a deposition chamber of over six feet in length in order to provide an annual output of 1.5 megawatts of electrical power. The 1.5 megawatt processor also includes additional chambers for (1) the payoff and takeup of the web of substrate material, (2) the cleaning of the web of substrate material and (3) preventing interdiffusion of the gaseous contents of the adjacent deposition environments, said interdiffusion prevention preferably occuring in external gas gate boxes. With the addition of all of these chambers, the total length of the 1.5 megawatt processor comes to approximately 40 feet. Further, under operating conditions, the 1.5 megawatt processor utilizes only 10% of the process gas which is introduced thereinto. Accordingly, it must be appreciated that, while this 1.5 megawatt processor is the first apparatus capable of commercially fabricating photovoltaic devices; it is a complex, greatly elongated piece of machinery in which gas utilization has as yet to be optimized.

The assignee of the instant invention is now constructing a new and improved semiconductor processing machine for the production of significantly higher quantities of photovoltaic energy, about 25 megawatts of electrical power. it must be noted that in order to produce an annual output of 25 megawatts, the length of the machine must be increased so that this 25 megawatt processor will be at least an order of magnitude longer than the present 1.5 megawatt machine. Since not all of the reasons for this increased length are readily apparent, they will be enumerated in the following paragraphs.

A first reason for the elongation is that the new processor will be configured to fabricate tandem photovoltaic devices which comprise at least 3 and possibly 4 stacked cells; therefore the processor will require 9 to 12 dedicated deposition chambers instead of the six dedicated deposition chambers required by the present processor. As another factor in determining the length of the processor, and as mentioned previously, the length of each of the individual deposition chambers is dependent upon the thickness of each of the layers of semiconductor alloy material to be deposited thereon. The thickness of that material is, in turn, dependent upon, the rate of deposition of particular mixtures of precursor gases and the speed of the web of substrate material passing through that chamber of the processor. Consequently, if the rate of deposition of the precursor gas mixture remains constant (and Applicants find that increasing the rate of deposition of semiconductor alloy material tends to decrease the photovoltaic properties of that material), the web speed will also have to be kept constant and the deposition chambers in the 25 megawatt processor will have to be over sixteen times longer than in the 1.5 megawatt processor in order to deposit a sufficient quantity of semiconductor alloy material for fabricating photovoltaic devices which would provide an annual output of 25 megawatts of electrical power. Even assuming that the presently employed one foot wide web of substrate material were increased in size to a 2 foot width, a scaled-up version of the present processor which is designed to have a 25 megawatt capacity would still total approximately 400 feet in length. Even more significantly, in deposition apparatus of this size, the cathode utilized for the deposition of the thickest layer of semiconductor alloy material, i.e., the bottommost intrinsic layer of semiconductor alloy material of the tandem photovoltaic device, would have to be approximately 60 feet in length.

Clearly, a 400 foot long processor which requires the incorporation of a 60 foot long cathode presents many problems. The physical space required to house a machine greater than the length of 1½ football fields presents problems in plant design, location and cost. Additionally, the mechanical design and operation of such a large, complex machine creates engineering problems related to the maintenance of the required optical, electrical and structural characteristics of the deposited semiconductor alloy material. The length and weight of the 500 foot span of substrate material, which continuously moves through the deposition apparatus, makes web handling and steering difficult, which, in turn, provides for numerous problems in maintaining substrate tracking, alignment and support. Likewise, maintenance of preselected vacuum conditions and deposition parameters within the 400 foot long vacuum envelope which the web of substrate material must traverse is, at best, quite difficult. Similarly, physical maintenance, i.e., disassembly, cleaning, etc. of the deposition apparatus becomes a nightmare.

Even more importantly (because it directly relates to the deposition of uniform, high quality semiconductor alloy material), the large areas covered by some of the deposition cathodes in such a scaled-up 25 megawatt processor creates problems of plasma uniformity and gas utilization within the cathode and deposition regions. Of the foregoing, plasma uniformity poses the most significant problem. Due to the large area plasma regions created by such large area cathodes, nonuniformities in the ionized precursor process gas mixtures are likely to arise. More specifically, varying compositions of the activated process gas mixture along the length of a large area cathode will give rise to irregular and nonhomogeneous plasma sub-regions, which irregularities and nonhomogeneties will result in the deposition of nonuniform, nonhomogeneous layers of semiconductor alloy material.

Gas utilization, yet another major problem encountered in the 25 megawatt processor, may be defined as the yield of semiconductor alloy material per unit of process gas introduced into the processor. Gas utilization is relatively poor (only about 10%) in the 1.5 megawatt processor and if the utilization of feedstock process gases is not significantly improved in the 25 megawatt processor, the cost of said process gases would become one of the largest factors in determining the ability of amorphous photovoltaic devices to economically compete with crystalline devices or nonrenewable energy sources for a share of the power consumption market.

It should be abundantly clear from the foregoing discussion that, as the 1.5 megawatt continuous photovoltaic device production machine is scaled up to higher throughput capacities, it becomes an economic necessity to substantially reduce the overll length thereof and substantially improve gas utilization. Such improvements would result in a substantial savings of time, floor space, the cost of building the machine and the operating cost for the production of photovoltaic devices therein.

The Assignee of the instant application has previously disclosed the concept of utilizing a non-horizontally disposed cathode plate in order to simultaneously deposit semiconductor alloy material in discrete plasma regions developed adjacent both of the opposed faces of that plate. This concept is described in U.S. Pat. No. 4,423,701 filed Mar. 29, 1982 of Prem Nath and David A. Gattuso entitled Glow Discharge Deposition Apparatus Including A Non-Horizontally Disposed Cathode, which patent is assigned to the assignee of the instant invention. Prior to the disclosure of said patent, only one-half (one face) of the potential surface area (two faces) of an r.f. powered cathode plate was utilized from which to develop a plasma, thereby limiting to one the number of substrates on which layers of amorphous semiconductor alloy material could be simultaneously deposited. The vertical orientation of the cathode plate, as described in said patent, provided the further advantage that deposition debris which is generated during the decomposition of the precursor gaseous mixture could not as readily come to rest on the vertically disposed surface of the substrate. Therefore, a continuous processor, utilizing such a generally vertically disposed cathode plate arrangement, would require less down time for dismantling, cleaning and reassembling. Finally, said above-referenced patent recognized the possibility of utilizing two webs of substrate material for the simultaneous and continuous deposition onto each of the webs of successive layers of semiconductor alloy material as said webs moved through the discrete plasma regions, developed on both faces of the cathode plates in each of the deposition chambers, in a generally linear path of travel.

However, while the deposition apparatus generally disclosed in U.S. Pat. No. 4,423,701 described a process of and apparatus for developing a plasma region adjacent each of the opposed faces of a generally vertically disposed cathode plate in order to continuously and simulataneously deposit layers of semiconductor alloy material onto each of two webs of substrate material as those webs passed through a plurality of interconnected deposition chambers, that process still failed to solve the one problem primarily at issue herein, i.e., the problem of reducing the length of the continuous processor so as to provide a commercially viable deposition process capable of depositing successive layers of semiconductor alloy material for fabricating triple or four (quad) cell tandem photovoltaic devices and having an annual capacity of up to 25 megawatts of electrical power. It is further desirable that this 25 megawattt capacity processor have the ability to increase the utilization of feedstock gases (vis-a-vis, single web systems) and to decrease down time (vis-a-vis, single web systems) due to the necessity of dismantling, cleaning and reassembling the cathode plates thereof caused by the accumulation of deposition debris.

These and other objects and advantages of the present invention will become clear from the Detailed Description of the Invention, the Drawings and the Claims which follow.

BRIEF SUMMARY OF THE INVENTION

The instant invention is directed to apparatus for the continuous vapor deposition of layers of semiconductor alloy material. The apparatus includes a plurality of discrete chambers, each chamber of which is dedicated for the vapor deposition of a layer of semiconductor alloy material of a preselected conductivity type. Pumps are provided for vacuumizing each of the chambers and a substrate is continuously advanced through each of those chambers for the glow discharge deposition of semiconductor alloy material. The glow discharge means includes (1) a conduit for introducing a precursor mixture of process gases, (2) a conduit for exhausting nondeposited gases of the precursor mixture and (3) a means for decomposing the precursor mixture in a plasma region. An isolation chamber is operatively disposed between each of the adjacent discrete deposition chambers for isolating the gaseous environments of adjacent chambers from one another while providing for the passage of the substrate therebetween. The improvement in the apparatus comprises (1) means for directing the substrate through at least one of the deposition chambers in a non-linear path of travel, and (2) operatively structuring and disposing the decomposing means so as to develop a plurality of plasma regions in those chambers through which the substrate is non-linearly directed. At least two of the plurality of plasma regions are disposed in different non-linear portions of the path of travel through which the substrate is advanced so that the total length of the deposition apparatus may be substantially foreshortened, gas utilization and the throughput of the apparatus may be substantially increased and power consumption in developing the plasma may be substantially decreased.

In the preferred embodiment, the substrate may either be an elongated web of substrate material or a discrete substrate plate. When employed as a web, the substrate is adapted to be trained about a plurality of rollers for directing said web to assume the non-linear path of travel. The decomposing means includes a cathode plate which is adapted to receive electromagnetic energy for developing electromagnetic fields in the plasma region formed between the plate and the web of substrate material moving therepast. The web of substrate material is preferably directed by the turning rollers to move sequentially in a non-linear path of travel past both of the opposed faces of the cathode plate for depositing a layer of semiconductor alloy material from the plasma region developed adjacent each face thereof.

The cathode plate may be perforated so that the precurser gaseous mixture introduced into either side of the cathode plate is uniformly distributed on both sides thereof. The cathode plate is preferably disposed in a generally vertical plane and the web of substrate material is continuously directed past each of the faces thereof in a plane of travel generally parallel to the vertical plane of the cathode plate. At least one of the rollers is adapted to contact the deposition surface of the web which is trained thereabout. Ceramic magnets are spacedly disposed throughout each of the deposition chambers for urging the web of substrate material into a generally planar configuration during the travel thereof through each of the plasma regions.

In the preferred embodiment, at least one triad of deposition chambers are provided, each chamber adapted for the deposition of a layer of semiconductor alloy material of a preselected conductivity type. The first chamber of the triad is adapted for the deposition of a layer of n-type semiconductor alloy material therein, the second chamber of the triad is adapted for the deposition of a layer of intrinsic semiconductor alloy material therein and the third chamber of the triad is adapted for the deposition of a layer of p-type semiconductor alloy material therein. Additional triads of deposition chambers may be provided for depositing an additional number of cells in the tandem n-i-p-type photovoltaic device. The preferred embodiment includes tandem photovoltaic cells of the the dual, triple or quad variety.

The generally vertical orientation of the cathode plates forms a series of cathode towers past which the web of substrate material sequentially passes for the deposition thereonto of semiconductor alloy material. The particular types and percentages of component gases of the precursor gaseous mixture introduced into each of the cathode towers, the height of each of the cathode towers and the number of cathode towers may be selected so as to profile the depositing semiconductor alloy material. Further, an insulating film may be applied to one face of a cathode plate in one or more of the cathode towers for limiting the length of the plasma region through which the web of substrate material is adapted to pass.

There is also disclosed an improved method for the continuous vapor deposition of a layer of semiconductor alloy material of a preselected conductivity type in each of a plurality of discrete deposition chambers. Each chamber includes a plasma region in which a precursor gaseous mixture of process gases are decomposed and deposited onto a substrate continuously advancing therethrough. The improved method is adapted to foreshorten the legnth of the at least one of the chambers and increase the utilization of the precursor gaseous mixture therein. The improved method includes the steps of (1) directing the substrate through at least the one of the chambers in a non-linear path of travel and (2) developing a plurality of plasma regions in the chambers through which the substrate is non-linearly directed. At least two pluralities of plasma regions are disposed in different non-linear portions of the path of travel through which the substrate is advanced.

BRIEF DESCRIPTION OF THE DRAWINGS

FIG. 1 is a fragmentary, cross-sectional view of a tandem photovoltaic device, said device comprising a plurality of p-i-n type cells, each layer of the cells formed from a semiconductor alloy material;

FIG. 3 is a cross-sectional view of the interior configuration of one of the deposition chambers, depicted diagramatically in FIG. 2, through which the web of substrate material moves in a non-linear path of travel for the continuous deposition of semiconductor alloy material thereonto.

DETAILED DESCRIPTION OF THE DRAWINGS

I. The Photovoltaic Cell

Figure 2A:
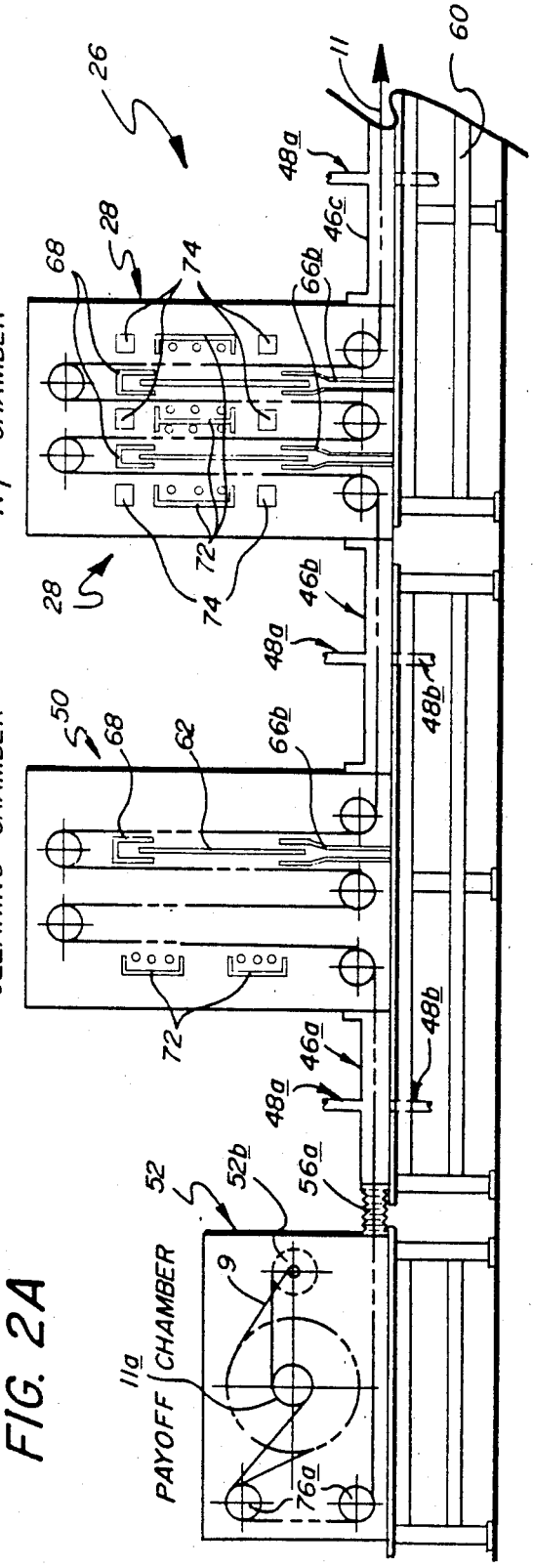
FIG. 2 is a schematic depiction of the vertically disposed, continuous deposition apparatus structured in accordance with the principles of the instant invention, said apparatus adapted to continuously deposit a plurality of successive, thin film layers of semiconductor alloy material upon a continuously advancing web of substrate material.

Referring now to the drawings and particularly to FIG. 1, a photovoltaic cell, formed of a plurality of successive p-i-n layers, each of which includes, preferably, an amorphous thin film semiconductor alloy material, and at least one of said layers formed by microwave energized glow discharge deposition, is shown generally by the reference numeral 10.

More particularly, FIG. 1 shows a p-i-n type photovoltaic device such as a solar cell made up of individual p-i-n type cells 12a, 12b and 12c. Below the lowermost cell 12a is a substrate 11 which may be transparent or formed from a metallic material such as stainless steel, aluminum, tantalum, molybdenum, chrome, or metallic particles embedded within an insulator. Although certain applications may require a thin oxide layer and/or a series of base contacts prior to the application of the amorphous material, for purposes of this application, the term "substrate" shall include not only a flexible film, but also any elements added thereto by preliminary processing. Also included within the scope of the present invention are substrates formed of synthetic polymers, glass or a glass-like material on which an electrically conductive electrode is applied.

Each of the cells 12a, 12b and 12c are preferably fabricated with a thin film semiconductor body containing at least a silicon alloy. Each of the semiconductor bodies includes a p-type conductivity semiconductor layer 20a, 20b and 20c; a substantially intrinsic semiconductor layer 18a, 18b and 18c; and an n-type conductivity semiconductor layer 16a, 16b and 16c. Note that the intrinsic layer may include traces of n-type or p-type dopant material without forfeiting its characteristic neutrality, hence it may be referred to herein as a "substantially intrinsic layer". As illustrated, cell 12b is an intermediate cell and, as indicated in FIG. 1, additional intermediate cells may be stacked atop the illustrated cells without departing from the spirit or scope of the present invention. Also, although n-i-p photovoltaic cells are illustrated, the methods and materials of this invention may also be and are preferably utilized to produce single or multiple p-i-n cells, accordingly, the term "n-i-p type" as used herein is meant to include any aggregation of n, i and p layers operatively disposed to provide a photoactive region for generating charge carriers in response to the absorption of photon energy. Additionally, the instant invention may be readily adapted to produce p-n cells, Schottky barrier cells, as well as other semiconductor or devices such as diodes, memory arrays, photoconductive devices and the like.

It is to be understood that following the deposition of the semiconductor alloy layers, a further deposition process may be either performed in a separate environment or as a part of a continuous process. In this step, a TCO (transparent conductive oxide) layer 22, preferably formed of indium tin oxide, is added. An electrode grid 24 may be added to the device where the cell is of a sufficiently large area, or if the conductivity of the TCO layer 22 is insufficient. The grid 24 is adapted to shorten the carrier path and increase the conductive efficiency.

II. The Multiple Chamber Apparatus

Figure 2B:
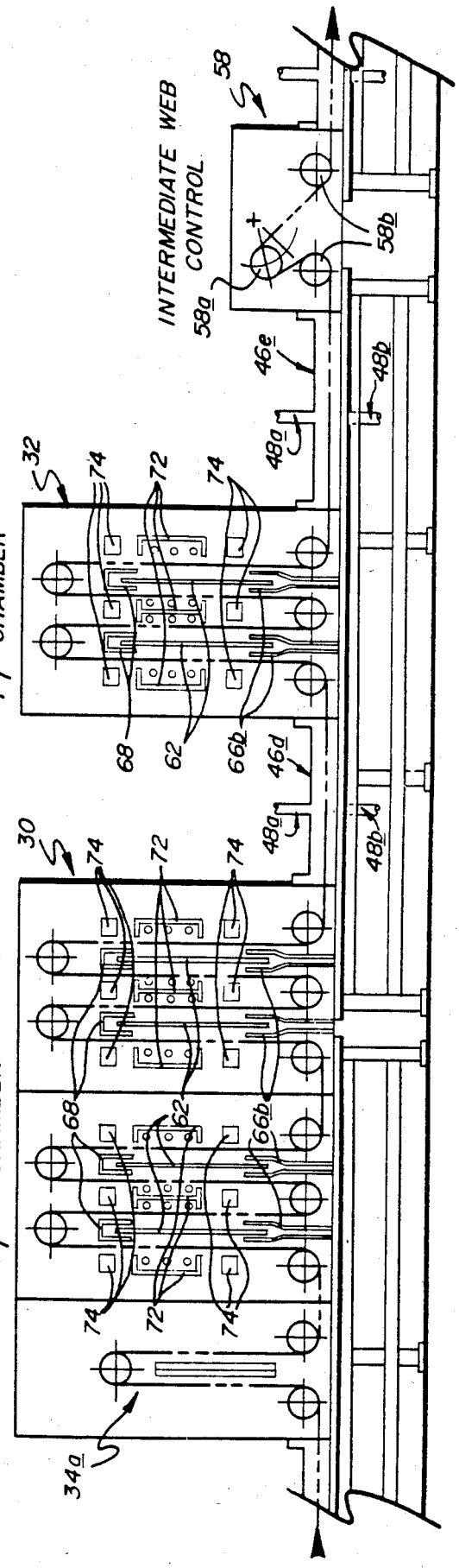

Turning now to FIG. 2, a generally diagrammatic representation of the multi-chambered glow discharge deposition processor for the continuous production of tandem or cascade-type photovoltaic cells is illustrated generally by the reference numeral 26. Due to the elongated nature of the processor 26 (the illustrated processor has a 25 megawatt capacity and is about 140 feet in length), it has been necessary to cut away and continue the longitudinal extent thereof in a plurality of rows across the sheets of drawings. However, and as should be readily apparent, in actual construction and operation, the processor 26 is preferably aligned so that each of the deposition chambers thereof is arranged in a generally linear arrangement. The processor 26 includes a plurality of isolated and dedicated deposition chambers in accordance with the principles of the instant invention. The term "dedicated" as used herein, will mean the precursor gaseous mixtures of each adjacent deposition chamber are substantially prevented from cross contaminating one another. Moreover, each deposition chamber has introduced thereinto a particular precursor gaseous mixture of process gases which is protected by an external isolation module from contamination from the precursor gaseous mixture introduced into adjacent deposition chambers and from environmental conditions.

The processor 26 is particularly adapted to deposit a high volume of large area amorphous triple tandem photovoltaic cells having a generally n-i-p-type configuration onto the deposition surface of the web of substrate material 11 which is continually fed therethrough. In order to deposit the semiconductor alloy material required for producing a tandem photovoltaic device of such an n-i-p-type configuration, the processor 26 includes: a first deposition chamber 28 in which an n-type conductivity layer of semiconductor alloy material is deposited onto the deposition surface of the web of substrate material 11 as said web passes therethrough; a second deposition chamber 30 in which a layer of substantially intrinsic semiconductor alloy material is deposited atop the layer of n-type semiconductor alloy material on the deposition surface of the web of substrate material 11 as the web 11 passes therethrough; a third deposition chamber 32 in which a layer of p-type conductivity semiconductor alloy material is deposited atop the layer of intrinsic semiconductor alloy material on the deposition surface of the web of substrate material 11 as the web passes therethrough; a fourth deposition chamber 34 in which a second n-type conductivity layer of semiconductor alloy material is deposited atop the layer of p-type semiconductor alloy material on the deposition surface on the web of substrate material as the web 11 passes therethrough; a fifth deposition chamber 36 in which a second layer of intrinsic amorphous semiconductor alloy material is deposited atop the second layer of p-type semiconductor alloy material on the deposition surface on the web of substrate material 11 as the web 11 passes therethrough; a sixth deposition chamber 38 in which a second layer of p-type conductivity semiconductor alloy material is deposited atop the second layer of intrinsic semiconductor alloy material on the deposition surface of the web of substrate material 11 as the web 11 passes therethrough; a seventh deposition chamber 40 in which a third layer of n-type conductivity semiconductor alloy material is deposited atop the second layer of n-type semiconductor alloy material on the deposition surface of the web of substrate material 11 as the web 11 passes therethrough; an eighth deposition chamber 42 in which a third layer of intrinsic semiconductor alloy material is deposited atop the third layer of n-type semiconductor alloy material on the deposition surface of the web of substrate material 11 as the web 11 passes therethrough; and a ninth deposition chamber 44 in which a third layer of p-type conductivity semiconductor alloy material is deposited atop the third layer of intrinsic semiconductor alloy material on the deposition surface of the web of substrate material 11 as the web 11 passes therethrough.

It should be apparent that, although nine discrete deposition chambers (three triads of the three deposition chambers) have been described, additional triad deposition chambers or individual deposition chambers may be added to the processor 26 to provide the machine with the capability of producing any number of tandem photovoltaic cells having a p-i-n-type or n-i-p-type or p-n-type or n-p-type configuration. It should further be understood that, although, in the preferred embodiment, the substrate is formed as a continuous, electrically conductive web of substrate material 11, the concept of the present invention is equally adapted for depositing the successive layers of semiconductor alloy material atop a continuous, electrically non-conductive substrate or atop discrete, electrically conductive or non-conductive substrate plates which are continuously fed through the plurality of deposition chambers thereof. It should also be apparent that since the length of the path of travel of the web of substrate material 11 through the individual deposition chambers is proportional to the thickness of the n-type, or the intrinsic, or the p-type layer of semiconductor alloy material to be deposited in any one of the given chambers, the length of the path of travel of the web of substrate material 11 through an individual deposition chamber must be increased (if the speed of the web of substrate material 11 is kept constant) in order to deposit a thicker layer thereupon. This can best be illustrated with reference to the first triad of deposition chambers in which the path of travel of the web 11 through the plasma regions of the intrinsic deposition chamber 30 can be seen to be much longer than the path of travel thereof through the plasma regions of either of the doped deposition chambers 28 and 32 because the intrinsic deposition chamber 30 is adapted for the deposition of a 3500 angstrom thick layer of intrinsic semiconductor alloy material while the doped deposition chambers 28 and 32 are adapted to only deposit layers of approximately 100 angstrom thick semiconductor alloy material.

Still referring to FIG. 2, the processor 26 further includes a plurality of external isolation modules 46a–46l for isolating the particular precursor gaseous mixture introduced into a particular deposition chamber from the mixtures introduced into adjacent chambers, each of said mixtures being operative to deposit a particular layer of semiconductor alloy material of preselected conductivity type. The isolation modules 46a–46l are preferably disposed externally of the deposition chambers and are adapted to permit the web of substrate material 11 to travel between the discrete deposition chambers which they interconnect while substantially preventing said inter-diffusion of said precursor gaseous mixture from one of a pair of adjacent chambers into the other of the pair. External isolation modules of this type are fully disclosed in U.S. Pat. No. 4,480,585 of David A. Gattuso entitled External Isolation Module, filed June 23, 1983, the disclosure of which is incorporated herewith by reference and the assignee of which is the same as the assignee of the present invention. Generally, the isolation modules 46a–46l are defined by a pair of elongated, horizontally-disposed, passageway-forming plates 47 (see FIG. 3), said plates adapted to be spacedly positioned in substantially parallel planes for defining the passageway therebetween. The web of substrate material 11 passing through the passageway divides the passageway into a pair of channels, i.e., an upper and lower channel. Sweep gas is uniformly introduced into each of the channels to prevent the diffusion of the precursor gaseous mixtures between the adjacent deposition chambers.

More specifically, each of the isolation modules 46a–46l includes an upper gas introductory conduit 48a which is adapted to introduce sweep gas, such as hydrogen or argon, into the upper channel of the passageway and a lower sweep gas introductory conduit 48b which is adapted to introduce sweep gas into the lower channel of the passageway. In this manner, a flow of sweep gas from a generally centrally disposed location (relative to the adjacent deposition chambers) of the isolation module 46a–46l is established in both directions so as to flow from each of the introductory conduits in both of the passageway channels into both of the adjacent deposition chambers to prevent the counter-diffusion of precursor gaseous mixtures from either of the chambers into those passageway channels and eventually into the other of the adjacent deposition chambers.

Positioned on the side of the first deposition chamber 28 opposite the second deposition chamber 30, and in operative interconnection therewith, is a substrate cleaning chamber 50 in which the web of substrate material continuously moving therethrough is subjected to high temperature (on the order of 450° C.) so as to bake out contaminants therefrom. A substrate cleaning plasma may also be developed within that chamber if it is deemed necessary to further rid the web of substrate material 11 of contaminants.

On the side of the cleaning chamber 50 opposite the first deposition chamber 30 is the substrate pay-off chamber 52 from which a roll of substrate material 11 is supplied, under tension, from a pay-off roll 11a to the deposition chambers of the processor 26. As the web 11 is unwound from the roll 11a, a sheet of protective interleaf sheeting 9 is wound about interleaf take-up roller 52b. Also present in the pay-off chamber 52 are a pair of idler turning rollers 76a for initially directing the web 11 in a generally horizontal path of travel through the processor 26.

Positioned on the side of the ninth deposition chamber 44 opposite the eighth deposition chamber 42 is a post deposition take-up chamber 54 in which the web of substrate material 11, with the layers of semiconductor alloy material deposited thereupon, is wound about a take-up core 11b. As the web 11 is wound about the take-up roll 11b, a sheet of protective interleaf sheeting 9 from an interleaf pay-off roller 54b is would thereabout. Also present in the take-off chamber 54 are a pair of idler turning rollers 76 for directing the web 11 from its normally horizontal path of travel into winding engagement with the take-up roll 11b.

The external isolation modules 46a and 46l both include a bellows section 56a and 56b, respectively, which bellows are adapted to compensate for expansion or contraction which occurs during operation of the processor 26. Intermediate at least the third deposition chamber 32 of the first triad and the first deposition chamber 34 of the second triad is an intermediate web controller chamber 58 in which a spring tensioning roller 58a is adapted to cooperate with a pair of turning rollers 58b for maintaining the proper tension on the web of substrate material 11. Although only one controller chamber 58 is depicted, it should be apparent that additional controller chambers may be added at any point along the path of travel of the web of substrate material 11 without depositing from the spirit or scope of the instant invention. It is also to be noted that each of the deposition chambers, external isolation modules and pay-off and take-up chambers are raised off of the floor and supported by a heavy-duty scaffolding generally depicted by the reference numeral 60. By raising the processor 26 from the floor, said processor is not as responsive to changes in environmental conditions such as heat or cold.

Referring now to FIG. 3, there is illustrated the interior configuration of one of the deposition chambers, such as the deposition chamber 40 in which the third layer of n-type semiconductor alloy material is to be deposited and through which the web of substrate material 11 is adapted to move in a non-linear path of travel. It is to be understood that the deposition chamber 40 depicted therein is merely intended to be representative of any of the deposition chambers of the processor 26 and that the third n-type deposition chamber 40 has been selected for purposes of illustration only since that deposition chamber requires the web of substrate material 11 to make only one non-linear pass therethrough for the deposition thereonto of the third n-type layer of semiconductor alloy material. An explanation of the operation of any of the other deposition chambers of the processor 26, such as the deposition chamber 30 in which the layer of intrinsic semiconductor material is adapted to make multiple non-linear passes, is easily derived from the explanation of the operation of the deposition chamber 40 which follows. This is because the web of substrate material 11 passes therethrough in a non-linear path of travel five times as compared to the single non-linear path of travel of the web of substrate material 11 through the deposition chamber 40 illustrated in FIG. 3.

Chamber 40 is one of the plurality of isolated dedicated deposition chambers operatively interconnected to adjacent deposition chambers, such as 38 and 42, by external isolation modules, such as 46i and 46j, respectively. Such external isolation modules 48 are also operatively disposed, in the preferred embodiment, between any of the chambers of the processor 26 which are not adapted to deposit semiconductor alloy material, but which cannot be allowed to contaminate the deposition chambers adjacent thereto.

The deposition chamber 40 includes a cathode plate 62 having a plurality of apertures formed therethrough so as to perforate same for the uniform mixing of process gases introduced into one side of the plate with the process gases introduced onto the other side of the cathode plate 62; an upper, transversely elongated, generally U-shaped cathode shield 68 which is adapted to restrict the precursor gaseous mixture entering the cathode region from an elongated apertured introductory manifold 64 from exiting the plasma region; and a lower transversely elongated cathode shield 66b which is adapted to prevent the non-deposited precursor gaseous mixture from leaving the cathode region after said mixture has passed through the plasma region developed between the web 11 and both of the faces of the cathode plate 62. The lower cathode shield 66b includes a conically-shaped portion which is operatively interconnected with the exhaust conduit 66 from which the non-deposited precursor gaseous mixture is exhausted from the deposition chamber 40. The lower cathode shield 66b further includes a plurality of apertures 66a disposed on both sides of the longitudinal extent thereof. Sweep gases introduced into the deposition chamber 40 from the sweep gas introductory conduits 48a and 48b are exhausted from said deposition chamber 40 through the apertures 66a. Since both the upper cathode shield 68 and lower cathode shield 66b are elongated members which extend across the full transverse extent of the deposition chamber and are coextensive with the transverse extent of the web of substrate material 11 and the cathode plate 62, the precursor gaseous mixture introduced into the plasma regions is substantially confined within those regions.

It is to be noted at this point that the precursor gaseous mixture introduced through the apertured introductory manifold 66 is adapted to assume a generally vertical path of travel as depicted by arrow A, said path of travel being generally parallel to the pth of movement of the web of substrate material through the plasma region. A plurality of banks of substrate heaters 72a, including heat reflecting shields 72, are operatively disposed on either side of the web of substrate material 11 so as to maintain the temperature thereof at the preselected deposition temperature. A plurality of elongated ceramic magnets 74 are also operatively disposed along the path of travel of the web of substrate material 11 so as to urge said web of substrate material 11 into a generally planar configuration as said web moves through the plasma region and has semiconductor alloy material deposited thereupon. A power source 70 which, in the preferred embodiment is a source of r.f. electromagnetic energy, is operatively coupled to the cathode plate 62 for generating an electromagnetic field between both faces of that cathode plate 62 and the conductive web of substrate material 11 passing therepast. In this manner, the precursor gaseous mixture flowing through the space developed between both faces of the cathode plate 62 and the web of substrate material 11 is subjected to an electromagnetic field and decomposed into a highly energetic plasma which is continuously deposited upon the moving web of substrate material 11.

It should therefore be apparent that the web of substrate material 11 is adapted to enter the deposition chamber 40 in a generally horizontal path of travel until it moves about a first turning roller 76a which rotatably engages a support 76. After passing about the first roller 76a, said web 11 assumes a generally vertical and upwardly directed path of travel past the plasma region created on the left-hand side of the cathode plate 62 so that semiconductor alloy material from the plasma region can be continuously deposited thereupon. At the upper end of the deposition chamber 40, a second turning roller 76b, also rotatably engaging a support 76, changes the direction of movement of the web of substrate material 11 from a vertical and upward direction to a downward and vertical direction through the plasma region developed on the right-hand face of the cathode plate 62 so that semiconductor alloy material from said right-hand region is continuously deposited thereupon. Finally, a third turning roller 76c, which is ratatable engagement with support 76, is adapted to change the direction of travel of the web of substrate material 11 from its downward and generally vertical direction to the horizontal direction which it must assume through the external isolation module 46j as it exits from the deposition chamber 40. Note that the circumferential periphery of the second turning roller 76b is in surface-to-surface contact with the deposition surface of the web of substrate material 11. However, the central portion of said roller 76b is recessed so that only the longitudinal edges of the web 11 are in contact with the circumferential periphery of the roller 76b and the semiconductor alloy material deposited thereupon is not scratched or otherewise marred by frictional contact with the roller (the longitudinal edges of the web 11 are subject to the deposition thereonto of poorer quality semiconductor alloy material than is deposited onto the central portion due to "edge effects" and the edges are therefore removed from the photovoltaic devices prior to modularization thereof).

As should now be apparent, there are important advantages to be gained when a layer of semiconductor alloy material is deposited on both of the opposed faces of the cathode plate 62 as the web of substrate material moves successively past each of those faces. Before enumerating those advantages, note that the number of vertically oriented cathode plates 62 disposed in a single deposition chamber and the relative heights of those plates is unlimited. The thicker the layer of semiconductor alloy material to be deposited upon the web of substrate material 11, the greater the number of such cathode plates 62 that will be disposed in a generally vertical orientation. In this manner, the first advantage of such vertical cathode orientation is realized, i.e., the total length of the processor 26 which would be needed if the web 11 was forced to assume the linear path of travel assumed by prior art processor is decreased. As a further advantage, a single power source 70 may be used to energize both of the opposed faces of the cathode plate 62 for developing the electromagnetic fields adjacent thereto, thereby decreasing the cost of capital equipment as well as the cost of power fed into the processor to develop the plasma regions. And as a final advantage, note that a single source of the precursor gaseous mixture is introduced into the cathode region for the simultaneous decomposition thereof under the influence of the electromagnetic fields created adjacent both faces of the cathode plate and the simultaneous deposition of semiconductor alloy material onto the web of substrate material 11, thereby using a greater percentage of the gas introduced into the chamber.

From the foregoing, it can be seen that by utilizing the principles of the instant invention (1) the total length of the processor 26 has been foreshortened, (2) the power necessary to deposit a given thickness of semiconductor alloy material has been decreased and (3) the percentage of utilization of the precursor gaseous mixture introduced into the deposition chamber has been increased. The result is the more efficient, more economical manufacture of photovoltaic devices in the continuous deposition processor 26 described herein.

One further advantage which may be gained through the use of the vertical cathode assembly of the instant invention is the ability to "profile" a depositing a layer of semiconductor alloy material. Profiling, as defined herein, is the introduction of a reduced or increased percentage of one component of a precursor gaseous material through a given thickness of a layer of semiconductor alloy material; for instance, the intrinsic layer is routinely profiled with an increasing amount of boron from the light incident surface thereof to the bottom of the layer so as to render the absorbtion of photons of incident light more uniform throughout the bulk of that intrinsic layer. Since (1) the precursor gaseous mixture introduced into each one of the vertically disposed cathode towers, (2) the height of each one of the vertically disposed cathode towers and hence the length of time the web of substrate material resides within the plasma regions thereof and the corresponding thickness of the layer of semiconductor alloy material deposited therefrom, and (3) the number of vertically disposed cathode towers, may all be discretely selected, the profiling of a given layer of semiconductor alloy material is readily accomplished. Note that if only a small percentage of a layer of semiconductor alloy material is to be profiled, it is also possible to electrically insulate one face of the cathode plate 62 so that a plasma region forms only adjacent the noninsulated face thereof. This is depicted, for illustrative purposes, in the first intrinsic deposition chamber 30 wherein the left hand cathode tower 34a is shorter than the remaining cathode towers. The left hand face of the tower 34a is also coated with an electrically insulating polyimide film, such as KAPTON (registered trademark of Dupont Corporation), so that only one plasma region is formed in which semiconductor alloy material can be deposited.

It should be understood that the present invention is not limited to the precise structure of the illustrated embodiment. It is intended that the foregoing description of the presently preferred embodiments be regarded as an illustration rather than as a limitation of the present invention, it is the claims which follow including all equivalents, which are intended to define the scope of this invention.

What is claimed is:

1. An improved method for the continuous vapor deposition of a layer of semiconductor alloy material of a preselected conductivity type in each of a plurality of discrete deposition chambers, each chamber including a plasma region in which a precursor gaseous mixture of process gases is decomposed and deposited onto a substrate continuously advanced therethrough; the improved method adapted to foreshorten the length of at least one of the chambers and increase the utilization of the precursor gaseous mixture including the steps of:
   directing the substrate through at least one of the chambers in a non-linear path of travel;
   developing a plurality of plasma regions in the chambers through which the substrate is non-linearily directed; at least two of the plurality of plasma regions disposed in different non-linear portions of the path of travel through which the substrate is advanced.

2. A method as in claim 1, including the further step of providing an elongated web of substrate material.

3. A method as in claim 2, including the further step of training the web of substrate material about turning rollers for assuming said non-linear path of travel in the cahmber in which the plurality of plasma regions are developed.

4. A method as in claim 3, including the further step of providing electromagnetic energy to a cathode plate for developing an electromagnetic field in the plasma region formed between said plate and the web of substrate material moving therepast.

5. A method as in claim 4, including the further step of disposing the turning rollers so as to sequentially move the web of substrate material past both of the opposed faces of the cathode plate for depositing semiconductor alloy material from the plasma region developed adjacent each face thereof.

6. A method as in claim 5, including the further steps of disposing the cathode plate in a generally vertical plane; and directing the web of substrate material past each of the faces of the cathode plate in a plane of travel generally parallel to the vertical plane of the cathode plate.

7. A method as in claim 4, including the further step of perforating the cathode plate so that process gases introduced into either side of the cathode plate are uniformly distributed on both sides thereof.

8. A method as in claim 3, including the further steps of providing a plurality of turning rollers; and training the deposition surface of the web of substrate material about at least one of the turning rollers.

9. A method as in claim 8, including the further step of coating at least one face of the cathode plate with an insulating film to prevent the development of a plasma region adjacent thereto.

10. A method as in claim 2, including the further step of constructing and operatively disposing at least one of the turning rollers so that only the longitudinal edges of the web of substrate material are in contact therewith.

11. A method as in claim 2, including the further step of spacedly disposing magnets throughout each of the chambers for urging the web of substrate material into a generally planar configuration during the travel thereof through each of the plasma regions.

12. A method as in claim 2, including the further step of providing at least one triad of deposition chambers, each chamber of the triad adapted for the deposition of a layer of semiconductor alloy material of a preselected conductivity type.

13. A method as in claim 12, including the further steps of adapting a first chamber of the triad for the deposition of a layer of n-type semiconductor alloy material therein; adapting a second chamber of the triad for the deposition of a layer of intrinsic semiconductor alloy material therein; and adapting a third chamber of the triad for the deposition of a layer of p-type semiconductor alloy material therein.

14. A method as in claim 13, including the further step of providing at least two triads of deposition chambers for depositing a two cell tandem n-i-p type photovoltaic device.

15. A method as in claim 14, including the further step of providing at least the intrinsic chamber of one of the triads with the plurality of plasma regions.

16. A method as in claim 13, including the further step of providing at least three triads of deposition chambers for depositing a three cell tandem n-i-p type photovoltaic device.

17. A method as in claim 16, including the further step of providing at least the intrinsic chamber of one of the triads with the plurality of regions.

18. A method as in claim 1, including the further steps of providing at least one discrete substrate plate; and utilizing an elongated conveyor belt for transporting the discrete substrate plate through the deposition chambers.

19. A method as in claim 1, including the further steps of providing at least three plasma regions and introducing into one of the regions, a different precursor gaseous mixture than is introduced into at least another one of the regions.

20. A method as in claim 19, including the further step of introducing a different percentage of a least one component of the precursor gaseous mixture into at least one of the plasma regions for profiling the depositing layer of semiconductor alloy material.

21. A method as in claim 20, including the further step of establishing a different length of path of travel of the web of substrate material through at least one of the plasma regions than the length of the path of travel of the web through at least one other region.

* * * * *